United States Patent
Walker et al.

(10) Patent No.: US 9,270,289 B2
(45) Date of Patent: Feb. 23, 2016

(54) MONOLITHIC SIGNAL GENERATION FOR INJECTION LOCKING

(71) Applicant: FUJITSU LIMITED, Kawasaki-shi, Kanagawa (JP)

(72) Inventors: William W. Walker, Los Gatos, CA (US); Nikola Nedovic, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 53 days.

(21) Appl. No.: 14/179,600

(22) Filed: Feb. 13, 2014

(65) Prior Publication Data

US 2015/0229316 A1    Aug. 13, 2015

(51) Int. Cl.

| | |
|---|---|
| *H03K 3/03* | (2006.01) |
| *H03L 7/099* | (2006.01) |
| *H03B 19/12* | (2006.01) |
| *H03B 1/00* | (2006.01) |
| *H03B 27/00* | (2006.01) |

(52) U.S. Cl.
CPC .............. *H03L 7/099* (2013.01); *H03B 1/00* (2013.01); *H03B 19/12* (2013.01); *H03B 27/00* (2013.01); *H03K 3/0315* (2013.01)

(58) Field of Classification Search
CPC .......... H03B 27/00; H03B 19/12; H03B 5/04; H03B 19/00; H03B 19/14; H03B 2200/0078; H03L 7/099; H03L 7/16; H03L 7/24; H03L 7/00; H03L 7/08; H03L 7/18; H03L 7/22; H03K 3/0315; H03K 3/0322
USPC .......... 331/167, 177 V, 116 FE, 116 R, 46, 2, 331/55, 51, 57
See application file for complete search history.

(56) References Cited

U.S. PATENT DOCUMENTS

| | | |
|---|---|---|
| 6,882,182 B1 | 4/2005 | Conn et al. |
| 7,015,765 B2 | 3/2006 | Shepard et al. |
| 7,237,217 B2 | 6/2007 | Restle |
| 8,704,603 B2 * | 4/2014 | Taghivand et al. ............. 331/46 |
| 2004/0066241 A1 * | 4/2004 | Gierkink et al. ................ 331/46 |
| 2011/0084772 A1 | 4/2011 | Papaefthymiou et al. |
| 2011/0090018 A1 | 4/2011 | Papaefthymiou et al. |
| 2011/0090019 A1 | 4/2011 | Papaefthymiou et al. |

OTHER PUBLICATIONS

T. Shibasaki et al., "20-GHz Quadrature Injection-Locked LC Dividers With Enhanced Locking Range" IEEE Journal of Solid-State Circuits, Vol. 43, No. 3, Mar. 2008.
B. Razavi, "Mutual Injection Pulling Between Oscillators", IEEE Custom Integrated Circuits Conference Digest of Technical Papers, pp. 675-678, Sep. 10-13, 2006.
N. Miura, et al, "Analysis and Design of Inductive Coupling and Transceiver Circuit for Inter-chip Wireless Superconnect", IEEEE Journal of Solid State Circuits, vol. 40, No. 4, pp. 829-837, Apr. 2005.
J. Poulton, et al, "A 14-mW 6.25-Gb/s Transeiver in 90nm CMOS", IEEE Journal of Solid State Circuits, vol. 42, 1. No. 12, pp. 2745-2757, Dec. 2007.

* cited by examiner

*Primary Examiner* — Arnold Kinkead
(74) *Attorney, Agent, or Firm* — Maschoff Brennan

(57) ABSTRACT

A system for signal generation may include a phase-locked-loop including a first oscillator. The system may also include a second oscillator. The first oscillator may be configured to generate a first signal based on a phase-locked-loop control signal generated by the phase-locked-loop. The second oscillator may be configured to generate a second signal based on the phase-locked-loop control signal such that a free-running frequency of the first signal is approximately equal to a free-running frequency of the second signal to obtain injection locking between the first oscillator and the second oscillator when energy from the first oscillator is coupled into the second oscillator.

19 Claims, 6 Drawing Sheets

MONOLITHIC SIGNAL GENERATION FOR INJECTION LOCKING

FIELD

The embodiments discussed herein are related to monolithic signal generation for injection locking.

BACKGROUND

Clock distribution or the generation of multiple clocks is becoming more and more common in multi-processors, multi-channel high-speed transceivers, and many other types of synchronous systems. For example, some recent multi-lane transceivers operate at 25 gigabits/sec and above per lane of the transceiver, resulting in the transceivers having clocks operating at 25 gigahertz or more in each lane of the transceivers for a full-rate architecture, or 12.5 Ghz or more for a half-rate architecture. The power to distribute or generate clocks operating at these frequencies for each lane is consuming a larger portion of the total power of these transceivers. Furthermore, controlling jitter on distributed clocks operating at 25 gigahertz and higher is becoming increasingly difficult.

Current methods of distributing clocks to each lane of a transceiver include a central phase-locked-loop (PLL) that generates one clock and repeaters that distribute the clocks to other lanes. These repeaters typically are power hungry, create duty cycle distortion, and jitter. Alternately or additionally, a PLL may be included in each lane to generate a clock for each lane of a transceiver. However, having a PLL in each lane may result in high power consumption and large area overhead.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a system for signal generation may include a phase-locked-loop including a first oscillator. The system may also include a second oscillator. The first oscillator may be configured to generate a first signal based on a phase-locked-loop control signal generated by the phase-locked-loop. The second oscillator may be configured to generate a second signal based on the phase-locked-loop control signal such that a free-running frequency of the first signal is approximately equal to a free-running frequency of the second signal to obtain injection locking between the first oscillator and the second oscillator when energy from the first oscillator is coupled into the second oscillator.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to an aspect of an embodiment, a system and method is disclosed herein for generating signals with the same frequencies. For example, the system and method may be used to generate clock signals of the same frequencies for use in multiple lanes of a high-speed transceiver. In some embodiments, an example system may include a phase-locked-loop (PLL) with a first oscillator. The system may also include one or more second oscillators that are calibrated so that the first oscillator and the second oscillator may be electrically or magnetically injection locked. When the first and second oscillators are injection locked, they may generate signals with the same frequencies.

Some conditions that result in injection locking of two oscillators are illustrated in the following equation:

$$\alpha\_min = Q \times (\omega\_1 - \omega\_2)/\omega\_0$$

where $\alpha\_min$ is the minimum coupling strength for injection locking, Q is the quality factor of the oscillators, $\omega_1$ and $\omega_2$ are the free-running frequencies of the two oscillators (the frequencies of the oscillators before injection locking), and $\omega_0$ is the locked frequency of the oscillators once they are injection locked. In some circumstances, achieving large coupling strengths between oscillators may be difficult. For example, larger magnetic coupling strength between oscillators may be achieved by placing the oscillators closer together or by introducing magnetic material into the oscillators, both of which may be undesirable in some system designs. As another example, larger electrical coupling strengths between oscillators may be achieved by increasing the amount of power provided for the electrical injection locking. As a result, smaller values of a min may be desirable in some circumstances.

Smaller values of $\alpha\_min$ may be achieved by reducing the Q of the oscillators or reducing a difference between the free-running frequencies of the oscillators. Reducing the Q of the oscillators may be undesirable as a reduced Q may result in increased jitter or increased phase noise of signals generated by the oscillators. According to some embodiments, a system and method is disclosed herein that provides oscillators with a reduced difference between the free-running frequencies of signals generated by the oscillators. By reducing the difference between the free-running frequencies of signals generated by the oscillators, the coupling strength to injection lock the oscillators may be reduced. In some embodiments, the differences between the frequencies of signals generated by the oscillators may be reduced by sharing a control signal among the oscillators as well as by calibrating the oscillators.

Embodiments of the present invention will be explained with reference to the accompanying drawings.

Figure 1:
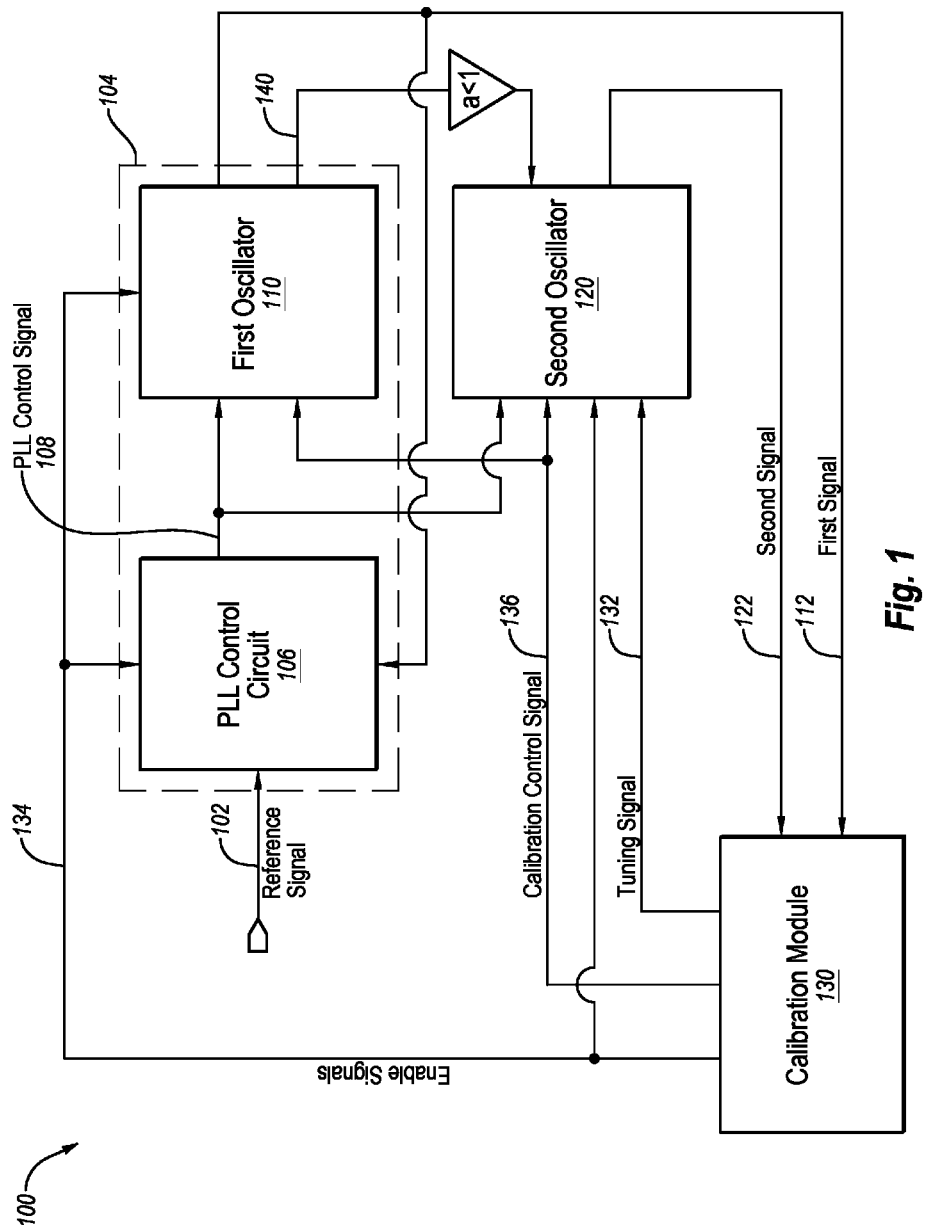
FIG. 1 is a block diagram of an example signal generation system.

FIG. 1 is a block diagram of an example signal generation system 100 ("the system 100"), arranged in accordance with at least one embodiment described herein. The system 100 may include a PLL 104, which includes a PLL control circuit 106 and a first oscillator 110, a second oscillator 120, and a calibration module 130.

The PLL control circuit 106 may be communicatively coupled with the first oscillator 110, the second oscillator 120, and the calibration module 130. The first oscillator 110 may be communicatively coupled to the PLL control circuit 106 and the calibration module 130. The calibration module 130 may be communicatively coupled with the second oscillator 120. The calibration module 130 may also be communicatively coupled to the PLL control circuit 106 and the first oscillator 110.

The PLL 104 may be configured to receive a reference signal 102 and to generate and output a first signal 112. The first signal 112 may have a frequency and a phase that is related to a frequency and a phase of the reference signal 102. In particular, the PLL control circuit 106 may be configured to receive the reference signal 102 and the first signal 112 and to compare the reference signal 102 and the first signal 112. Based on the comparison of the reference signal 102 and the first signal 112, the PLL control circuit 106 may be configured to generate a PLL control signal 108 and to output the PLL control signal 108. The PLL control signal 108 may be configured to control the first oscillator 110 and the second oscillator 120. In some embodiments, the PLL control signal 108 may be an analog signal or a digital signal or a combination of analog and digital signals. When the PLL control signal 108 is an analog signal, the PLL control signal 108 may be a voltage or a current signal.

The second oscillator 120 may be configured to generate a second signal 122 and to output the second signal 122. During operation of the system 100, the second oscillator 120 may be configured to generate the second signal 122 based on the received PLL control signal 108, an injection locking signal 140, and a tuning signal 132 received from the calibration module 130. During calibration of the system 100, the second oscillator 120 may be configured to generate the second signal 122 based on the tuning signal 132 and a calibration control signal 136 received from the calibration module 130.

The calibration module 130 may be configured to generate the tuning signal 132 and to output the tuning signal 132. In some embodiments, the calibration module 130 may generate the tuning signal 132 based on a comparison between free-running frequencies of the first signal 112 and the second signal 122. The calibration module 130 may be further configured to generate a calibration control signal 136 and to output the calibration control signal 136 to the first oscillator 110 and the second oscillator 120.

In some embodiments, the calibration module 130 may be configured to generate enable/disable signals 134 for the PLL control circuit 106, the first oscillator 110, and the second oscillator 120.

In some embodiments, the calibration module 130 may be a circuit. In these and other embodiments, the calibration module 130 may include a frequency counter to measure the frequency of the first and second signals 112 and 122, registers to store the frequency of the first signal 112 and the tuning signal 132, and control logic, such as a finite state machine. Alternately or additionally, the calibration module 130 may be a combination of hardware and computer-executable instructions configured to be executed by a processor or the like.

The system 100 may be configured so that the first signal 112 and the second signal 122 generated by the first oscillator 110 and the second oscillator 120, respectively, have approximately the same frequencies so that the first oscillator 110 and the second oscillator 120 may be injection locked. To cause the frequencies of the first signal 112 and the second signal 122 to be approximately the same, the system 100, and in particular, the second oscillator 120 may be calibrated.

A discussion of the calibration of the second oscillator 120 follows. In some embodiments, to begin calibration, the calibration module 130 may enable the first oscillator 110 and disable the second oscillator 120 and the PLL control circuit 106 by sending enable/disable signals 134 to the first oscillator 110, the second oscillator 120, and the PLL control circuit 106. The calibration module 130 may then generate and send the calibration control signal 136 to the first oscillator 110. Based on the calibration control signal 136, the first oscillator 110 may generate the first signal 112 and send the first signal 112 to the calibration module 130. The calibration module 130 may measure and store a frequency of the first signal 112. During calibration, the first signal 112 may be free running, indicating that the first signal 112 is not based on a feedback loop configuration provided by the PLL 104, but based on the calibration control signal 136.

After receiving the first signal 112, the calibration module 130 may disable the first oscillator 110 and enable the second oscillator 120. After enabling the second oscillator 120, the second oscillator 120 may generate the second signal 122 based on the calibration control signal 136 being provided by the calibration module 130. The calibration module 130 may measure the frequency of the second signal 122 and compare the frequency of the second signal 122 to the frequency of the first signal 112. Based on the comparison of the frequency of the second signal 122 and the frequency of the first signal 112, the calibration module 130 may generate a tuning signal 132. The tuning signal 132 may be sent to the second oscillator 120. The tuning signal 132 may cause the second oscillator 120 to adjust the frequency and/or the phase of the second signal 122. During calibration, the second signal 122 may be free running, indicating that the second signal 122 is not based on a PLL type feedback loop or injection locked, but based on the calibration control signal 136 and the tuning signal 132.

The calibration module 130 may measure the frequency of the adjusted second signal 122 and compare the frequency of the adjusted second signal 122 with the frequency of the first signal 112. Based on the comparison, the calibration module 130 may modify the tuning signal 132 being provided to the second oscillator 120. In this manner, the calibration module 130 may continue to modify the tuning signal 132 until the difference between the frequencies of the first and second signals 112 and 122 are within a particular range. For example, in some embodiments, the calibration module 130 may continue to modify the tuning signal 132 until the difference between the frequencies of the first and second signals 112 and 122 are within 1000 Hz; 10,000 Hz; 50,000 Hz; or some other difference. In some embodiments, the particular range may be determined based on a coupling strength between the first oscillator 110 and the second oscillator 120. After the difference between the frequencies of the first and second signals 112 and 122 is within a particular range, the calibration module 130 may stop modifying the tuning signal 132 and may store the tuning signal 132. This may end the calibration of the second oscillator 120.

After calibrating the second oscillator 120, the calibration module 130 may enable the PLL control circuit 106, the first oscillator 110, and the second oscillator 120. The PLL control circuit 106 may generate the PLL control signal 108 and may provide the PLL control signal 108 to the first oscillator 110 and to the second oscillator 120. The calibration module 130 may provide the tuning signal 132 resulting from the calibration of the second oscillator 120 to the second oscillator 120.

The first oscillator 110 may generate the first signal 112 based on the PLL control signal 108 and the second oscillator 120 may generate the second signal based on the PLL control signal 108, the tuning signal 132, and the injection locking signal 140. During non-calibration operation of the system 100, the first signal 112 may not be free running, but may be controlled by the PLL 104. Likewise, the second signal 122 may not be free running, but may be injection locked.

The free-running frequencies of the first and second signals 112 and 122 may be approximately equal such that the first oscillator 110 and the second oscillator 120 may be coupled through injection locking. In some embodiments, while the first and second oscillators 110 and 120 are injection locked, the frequencies of the first and second signals are equal. A small change in the reference signal or some aspect of the system 100 may result in a change in the PLL control signal 108. However, because both the first oscillator 110 and the second oscillator 120 are operating based on the PLL control voltage, a change in the system 100 may result in changes to the frequencies and/or phases of both the first and second signals 112 and 122. As a result, a change in the PLL control voltage does not result in a change in a difference between the first and second signals 112 and 122 that may result in the first and second oscillators 110 and 120 falling out of injection lock.

In some embodiments, the first and second oscillators 110 and 120 may be magnetically injection locked. In these and other embodiments, the injection locking signal 140 may be a magnetic coupling between the first and second oscillators 110 and 120. The gain of the injection locking signal 140 is less than one, indicating a reduced amount of power, relative to the power associated with the first oscillator, that is provided from the first oscillator 110 to the second oscillator 120 to injection lock the first and second oscillators 110 and 120. The reduced amount of power is due to the free-running frequencies of the first and second signals 112 and 122 being approximately equal before the first and second signals 112 and 122 are injection locked.

Alternately or additionally, the first and second oscillators 110 and 120 may be electrically injection locked. In these and other embodiments, the injection locking signal 140 may be the first signal 112 that is supplied from the first oscillator 110 to the second oscillator 120. The gain of the injection locking signal 140 is less than one, indicating that only a portion of the first signal 112 is provided to the second oscillator 120 for injection locking. The reduced amount of power is due to the free-running frequencies of the first and second signals 112 and 122 being approximately equal before the first and second signals 112 and 122 are injection locked.

In some embodiments, the tuning signal 132 may adjust an amount of capacitance used by the second oscillator 120 when generating the second signal 122. Alternately or additionally, the tuning signal 132 may adjust a frequency band of operation of the second oscillator 120. In some embodiments, the system 100 may be part of a transceiver. In these and other embodiments, the first and second signals 112 and 122 may be clock signals.

In some embodiments, the first oscillator 110 and the second oscillator 120 may be analog or digital oscillators. For example, either or both of the first oscillator 110 and the second oscillator 120 may be voltage-controlled oscillators, numerically-controlled oscillators, or digitally-controlled oscillators. In some embodiments, the PLL 104 may be a type I PLL, a type II PLL, a type III PLL, or other type of PLL. In some embodiments, the first oscillator 110 and the second oscillator 120 may be of the same oscillator type, such as ring oscillators or LC-Tank oscillators. Alternately or additionally, the first and second oscillators 110 and 120 may be different types of oscillators.

Modifications, additions, or omissions may be made to the system 100 without departing from the scope of the present disclosure. For example, in some embodiments, some other module or circuit may provide the enable signals 134 to the PLL control circuit 106, the first oscillator 110, and the second oscillator 120. Furthermore, while the system 100 is depicted as including a single second oscillator 120, the system 100 may include multiple oscillators that may operate analogous to the second oscillator 120. Each of the multiple oscillators may receive the PLL control signal 108 from the PLL control circuit 106. Alternately or additionally, each of the multiple oscillators may receive an individual tuning signal from the calibration module 130 that is determined during a calibration mode for each of the multiple oscillators. Alternately or additionally, the calibration control signal 136 and the PLL control signal 108 may be communicated on the same bus.

Alternately or additionally, the system 100 may further include one or more dividers to divide the first signal 112 and the second signal 122 before providing the first and second signals 112 and 122 to the calibration module 130. In these and other embodiments, the divided first and second signals 112 and 122 may be compared by the calibration module 130. By providing the divided first and second signals 112 and 122 to the calibration module 130, a complexity of circuitry to measure the frequency of the first and second signals 112 and 122 may be reduced and power requirements to provide the first and second signals 112 and 122 to the calibration module 130 may be reduced.

Figure 2:
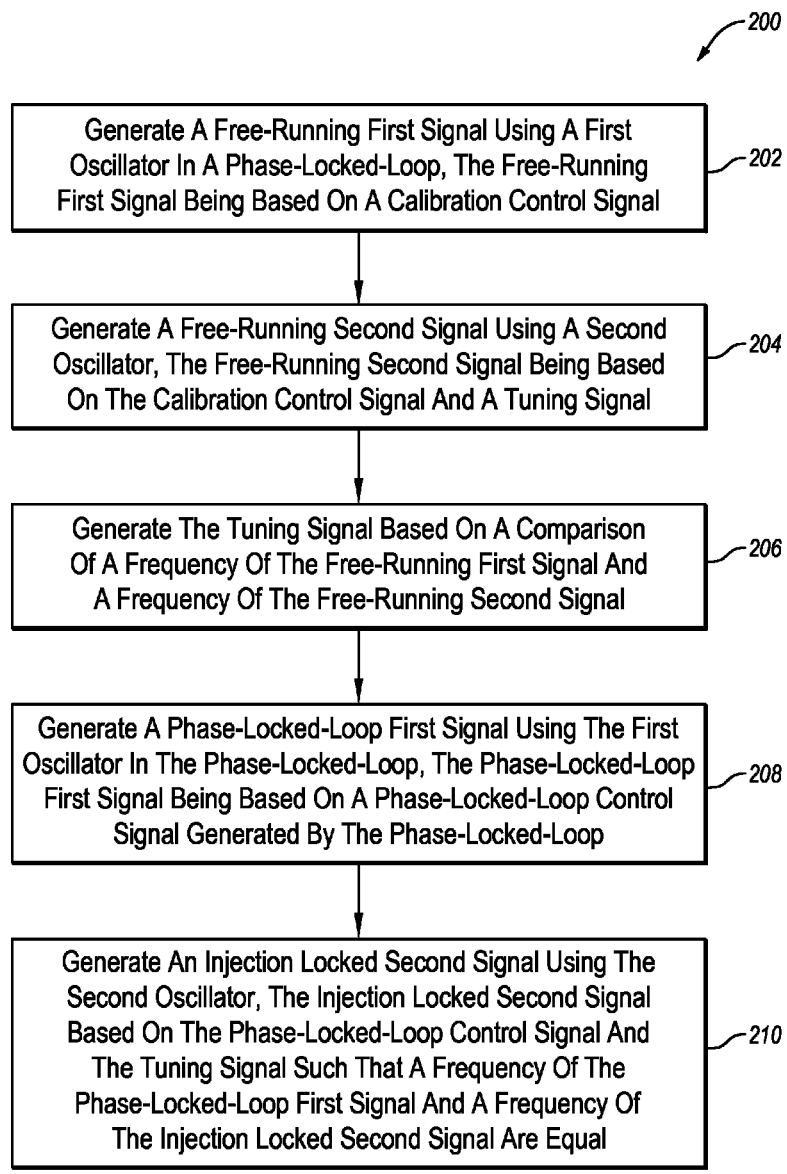
FIG. 2 is a flowchart of an example method of generating signals.

FIG. 2 is a flowchart of an example method 200 of generating a signal, arranged in accordance with at least one embodiment described herein. The method 200 may be implemented, in some embodiments, by a signal generation system, such as the system 100 of FIG. 1. Although illustrated as discrete blocks, various blocks may be divided into additional blocks, combined into fewer blocks, or eliminated, depending on the desired implementation.

The method 200 may begin at block 202, where a free running first signal may be generated using a first oscillator in a PLL. The free running first signal may be based on a calibration control signal.

In block 204, a free running second signal may be generated using a second oscillator. The free running second signal may be based on the calibration control signal and a tuning signal. In some embodiments, the first oscillator may be of a first oscillator type and the second oscillator may be of a second oscillator type different from the first oscillator type.

In block 206, the tuning signal may be generated based on a comparison of a frequency of the free-running first signal and a frequency of the free-running second signal. In some embodiments, generating the tuning signal may include comparing the frequency of the free-running first signal and the frequency of the free-running second signal and modifying the tuning signal until the frequency of the free-running first signal and the frequency of the free-running second signal are approximately equal.

In some embodiments, modifying the tuning signal may modify a capacitance used by the second oscillator to generate the free-running second signal. Alternately or additionally, modifying the tuning signal may modify a frequency band of operation of the second oscillator.

In block 208, a phase locked loop first signal may be generated using the first oscillator in the PLL. The phase locked loop first signal may be based on a PLL control signal generated by the PLL.

In block 210, an injection locked second signal may be generated using the second oscillator. The injection locked second signal may be based on the PLL control signal and the tuning signal such that a frequency of the phase-locked-loop first signal and a frequency of the injection locked second signal are equal.

In some embodiments, the phase-locked-loop first signal and the injection locked second signal may be further based on a frequency band select signal. In some embodiments, the frequency of the phase-locked-loop first signal and the frequency of the injection locked second signal may be equal resulting from injection locking between the first oscillator and the second oscillator.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 200 may further include supplying at least a portion of the phase-locked-loop first signal to the second oscillator to obtain electrical injection locking between the first oscillator and the second oscillator. Alternately or additionally, the method 200 may further include disabling the first oscillator when modifying the tuning signal until the frequency of the free-running first signal and the frequency of the free-running second signal are approximately equal.

Figure 3:
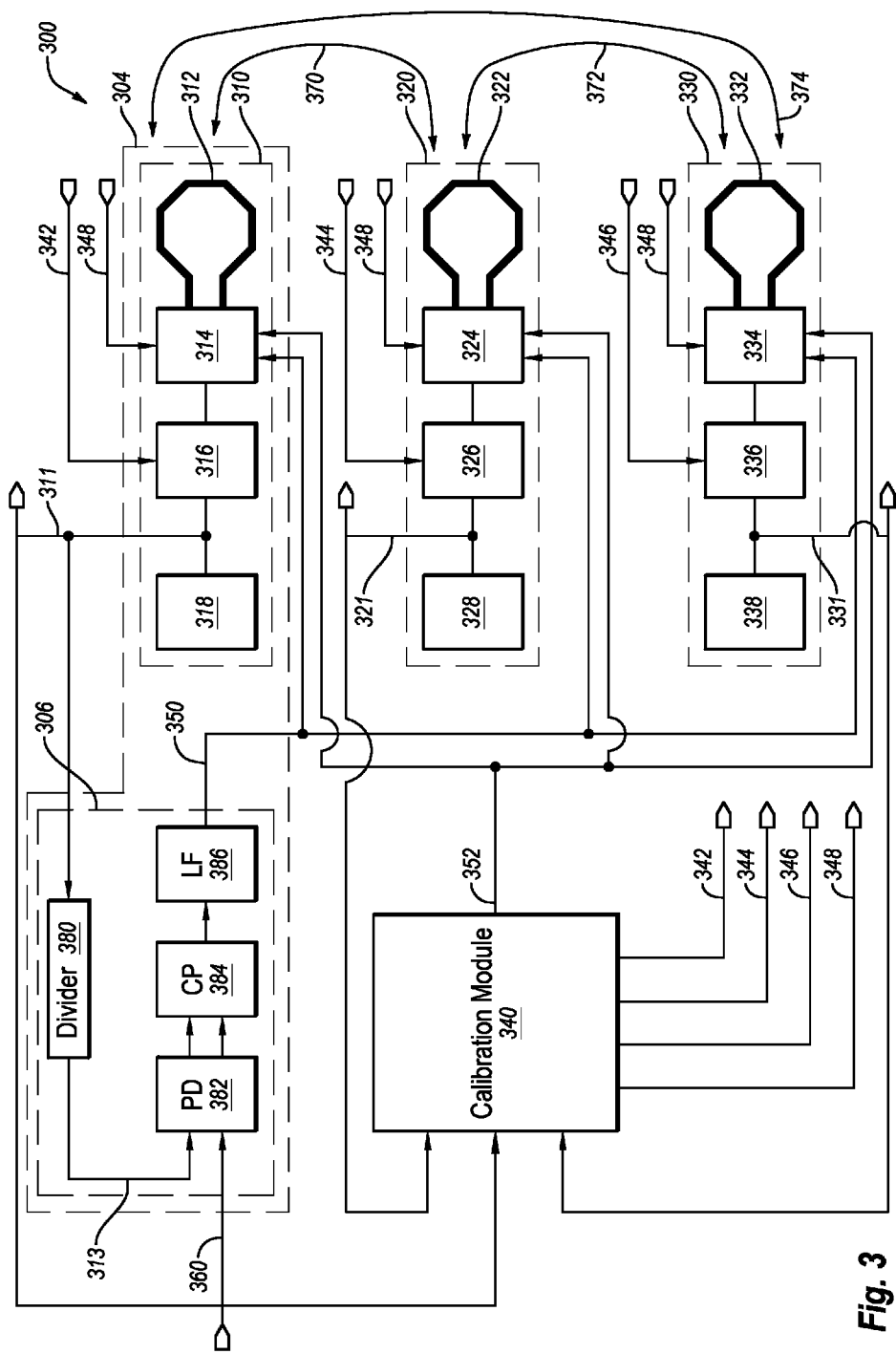
FIG. 3 is a block diagram of another example signal generation system.

FIG. 3 is a block diagram of another example signal generation system 300 ("the system 300"), arranged in accordance with at least one embodiment described herein. The system 300 may include a PLL 304, which includes a PLL control circuit 306 and a first oscillator 310. The system 300 may also include a second oscillator 320, a third oscillator 330, and a calibration module 340.

The first oscillator 310 may include an inductor 312, a first capacitor bank 314, a second capacitor bank 316, and a gain block 318. The first oscillator 310 may be configured to generate a first signal 311 and to output the first signal 311 to the first oscillator 310, the PLL control circuit 306, and the calibration module 340. A frequency and a phase of the first signal 311 may depend on an amount of capacitance selected in the first capacitor bank 314 and the second capacitor bank 316 and the inductance of the inductor 312. The gain block 318 may provide the energy to cause an oscillation between the capacitance selected in the first capacitor bank 314 and the second capacitor bank 316 and the inductance of the inductor 312 that results in the first signal 311.

An adjust signal 342 received from the calibration module 340 may select an amount of capacitance contributed by the second capacitor bank 316 to generate the first signal 311. A frequency band select signal 348 received from the calibration module 340 may select an amount of capacitance contributed by the first capacitor bank 314 to generate the first signal 311.

The second oscillator 320 may include an inductor 322, a first capacitor bank 324, a second capacitor bank 326, and a gain block 328. The second oscillator 320 may be configured to generate a second signal 321 and to output the second signal 321 to the second oscillator 320 and the calibration module 340. A frequency and a phase of the second signal 321 may depend on an amount of capacitance selected in the first capacitor bank 324 and the second capacitor bank 326 and the inductance of the inductor 322. The gain block 328 may provide the energy to cause an oscillation between the capacitance selected in the first capacitor bank 324 and the second capacitor bank 326 and the inductance of the inductor 322 that results in the second signal 321.

A first tuning signal 344 received from the calibration module 340 may select an amount of capacitance contributed by the second capacitor bank 326 to generate the second signal 321. The frequency band select signal 348 may be received by the second oscillator 320 from the calibration module 340 and may select an amount of capacitance contributed by the first capacitor bank 324 to generate the second signal 321.

The third oscillator 330 may include an inductor 332, a first capacitor bank 334, a second capacitor bank 336, and a gain block 338. The third oscillator 330 may be configured to generate a third signal 331 and to output the third signal 331 to the third oscillator 330 and the calibration module 340. A frequency and a phase of the third signal 331 may depend on an amount of capacitance selected in the first capacitor bank 334 and the second capacitor bank 336 and the inductance of the inductor 332. The gain block 338 may provide the energy to cause an oscillation between the capacitance selected in the first capacitor bank 334 and the second capacitor bank 336 and the inductance of the inductor 332 that results in the third signal 331.

A second tuning signal 346 received from the calibration module 340 may select an amount of capacitance contributed by the second capacitor bank 336 to generate the third signal 331. The frequency band select signal 348 may be received by the third oscillator 330 from the calibration module 340 and may select an amount of capacitance contributed by the first capacitor bank 334 to generate the third signal.

The PLL control circuit 306 may include a divider 380, a phase detector (PD) 382, a charge pump (CP) 384, and a low pass filter (LF) 386. The divider 380 may be configured to receive the first signal 311 and to divide the first signal 311. The divided first signal 313 may be provided to the PD 382. The PD 382 may receive the divided first signal 313 and a reference signal 360 and may compare a phase of the divided first signal 313 and the reference signal 360. Based on the comparison, the PD 382 may generate error signals that are sent to the CP 384. The CP 384 integrates the error signals and generates a PLL control signal 350 that is low pass filtered by the LF 386 and output by the PLL control circuit 306. In some embodiments, the PD 382 may be replaced by a Phase-Frequency Detector (PFD).

The PLL control signal may be provided to the first, second, and third oscillators 310, 320, and 330. In particular, the PLL control signal 350 is provided to and adjusts a capacitance of the first capacitor bank 314 used by the first oscillator 310 to generate the first signal 311, a capacitance of the first capacitor bank 324 used by the second oscillator 320 to generate the second signal 321, and a capacitance of the first capacitor bank 334 used by the third oscillator 330 to generate the third signal 331.

The calibration module 340 may be configured to generate the adjust signal 342 and to output the adjust signal 342. The calibration module 340 may further be configured to generate the first tuning signal 344 and to output the first tuning signal 344, to generate the second tuning signal 346 and to output the second tuning signal 346, to generate the frequency band select signal 348 and to output the frequency band select signal 348, and to generate a calibration control signal 352 and to output the calibration control signal 352 to the first, second, and third oscillators 310, 320, and 330.

The calibration control signal 352 may be configured to adjust a capacitance of the first capacitor bank 314 used by the first oscillator 310 to generate the first signal 311, a capacitance of the first capacitor bank 324 used by the second oscillator 320 to generate the second signal 321, and a capacitance of the first capacitor bank 334 used by the third oscillator 330 to generate the third signal 331. Note that the calibration control signal 352 is provided to the first, second, and third oscillators 310, 320, and 330 during calibration of the system 300 and the PLL control signal 350 is provided to the first, second, and third oscillators 310, 320, and 330 during non-calibration operation of the system 300 so that these signals are not both provided to the first, second, and third oscillators 310, 320, and 330 at the same time.

The calibration module 340 may be further configured to enable or disable the PLL control circuit 306, the first oscillator 310, the second oscillator 320, and the third oscillator 330. Note that FIG. 3 does not depict the calibration module 340 providing an enable signal to enable or disable the PLL control circuit 306, the first oscillator 310, the second oscillator 320, and the third oscillator 330 for clarity in FIG. 3, but the enable signals may be conveyed in similar manner as depicted in FIG. 1 with respect to the calibration module 130.

The system 300 is configured to bring the free-running frequencies of the first, second, and third signals 311, 321, and 331 to be approximately the same so that the first, second, and third oscillators 310, 320, and 330 may be injection locked. In particular, so that the first, second, and third oscillators 310, 320, and 330 may be magnetically injection locked. One manner to attempt to bring the free-running frequencies of the first, second, and third signals 311, 321, and 331 to be approximately the same may be to design the first, second, and third oscillators 310, 320, and 330 to be identical. However, even when the first, second, and third oscillators 310, 320, and 330 are designed to be identical, manufacturing processes are not perfect due to tolerances, errors, etc. As a result, the first, second, and third oscillators 310, 320, and 330 may be different after manufacturing even when designed to be the same. Because of the differences, the first, second, and third signals 311, 321, and 331 generated by the first, second, and third oscillators 310, 320, and 330, respectively, may not have the same free-running frequencies even when identical or approximately the same signals, such as the PLL control signal and the frequency band control signal are provided to the first, second, and third oscillators 310, 320, and 330.

To compensate for the differences, the first, second, and third oscillators 310, 320, and 330 are provided with the second capacitor banks 316, 326, and 336 that may be tuned by the calibration module 340. In particular, the second capacitor banks 326 and 336 of the second and third oscillators 320 and 330 may be tuned by the calibration module 340 until the free-running frequencies of the second and third signals 321 and 331 approximate the free-running frequency of the first signal 311.

A discussion of the calibration of the second oscillator 320 follows. In some embodiments, to begin calibration, the calibration module 340 may enable the first oscillator 310 and disable the second and third oscillators 320 and 330 and the PLL control circuit 306.

The calibration module 340 may then select a frequency band of operation for the first, second, and third oscillators 310, 320, and 330. Based on the desired frequency band, the calibration module 340 generates the frequency band select signal 348 and provides the frequency band select signal 348 to the first, second, and third oscillators 310, 320, and 330. If another frequency band is selected during operation of the system 300, the calibration of the system 300 may start over.

The calibration control signal 352 may then be generated by the calibration module 340 and provided to the first oscillator 310. In some embodiments, the calibration control signal 352 may be set at a value that is a middle value of the range of values for the calibration control signal 352. The adjust signal 342 may also be provided to the second capacitor bank 316 of the first oscillator 310. In some embodiments, the second capacitor banks 316, 326, and 336 may be arrays of fine tuning control varactors. In these and other embodiments, the adjust signal 342 may be set so that the varactors in the second capacitor bank 316 are set at a center point. The varactors in the second capacitor bank 316 may be set at the center point to give the greatest range for tuning the second capacitor banks 326 and 336 in the second and third oscillators 320 and 330.

With the first oscillator 310 generating the first signal 311 based on the adjust signal, the frequency band select signal 348, and the calibration control signal 352, the calibration module 340 may measure the frequency of the first signal 311. In some embodiments, the free-running frequency of the first signal 311 may be measured using a reference clock and a frequency counter.

After measuring the free-running frequency of the first oscillator 310, the calibration module 340 may disable the first oscillator 310. The calibration module 340 may provide the first tuning signal 344 to the second oscillator 320. In some embodiments, the first tuning signal 344 may be set so that the varactors in the second capacitor bank 326 are set at a center point.

After being enabled, the second oscillator 320 may generate the second signal 321 based on the first tuning signal 344, the frequency band select signal 348, and the calibration control signal 352. The calibration module 340 may measure a free-running frequency of the second signal 321 in a similar or different manner than the manner in which the free-running frequency of the first signal 311 is measured. The calibration module 340 may also compare the free-running frequencies of the first and second signals 311 and 321. When the free-running frequency of the second signal 321 is greater than the free-running frequency of the first signal 311 by more than a threshold, the calibration module may modify the first tuning signal 344 by decreasing the first tuning signal 344. When the free-running frequency of the second signal 321 is less than the free-running frequency of the first tuning signal 344 by more than the threshold, the calibration module may modify the first tuning signal 344 by increasing the first tuning signal 344. The threshold may be selected based on magnetic coupling strength between the first, second, and third oscillators 310, 320, and 330, an amount of capacitance in the second capacitor banks 316, 326, and 336, the precision of the second capacitor banks 316, 326, and 336 that helps to determine the finest tuning step of the second oscillator 320, among other criteria.

The calibration module 340 may continue to measure the free-running frequency of the second signal 321 and adjust the first tuning signal 344 until the free-running frequency of the second signal 321 is within the range of the threshold of the free-running frequency of the first signal 311. A value of the first tuning signal 344 that causes the free-running frequency of the second signal 321 to be within the range of the threshold of the free-running frequency of the first signal 311 may be stored by the calibration module 340. The calibration module 340 may then disable the second oscillator 320.

The calibration module 340 may then enable the third oscillator 330 and calibrate the third oscillator 330 by tuning the second tuning signal 346 in a similar manner as the calibration module 340 calibrates the second oscillator 320 as explained above.

After calibrating the second and third oscillators 320 and 330, the calibration module 340 may enable the PLL control circuit 306 so that the PLL control signal 350 is provided to the first, second, and third oscillators 310, 320, and 330. The calibration module 340 may provide the frequency band select signal 348 to the first, second, and third oscillators 310, 320, and 330, the adjust signal 342 to the first oscillator 310, and the calibrated first and second tuning signals 344 and 346 to the second and third oscillators 320 and 330, respectively. With the second and third oscillators 320 and 330 calibrated, the free-running frequencies of the first, second, and third signals 311, 321, and 331 may be approximately equal. As a result, the first, second, and third oscillators 310, 320, and 330 may be locked through magnetic injection with reduced power as compared to when the free-running frequencies of the first, second, and third signals 311, 321, and 331 are not approximately equal. In particular, the first and second oscillators 310 and 320 may be injection locked through magnetic coupling 370. The first and second oscillators 310 and 320 may be injection locked through magnetic coupling 372 and the second and third oscillators 320 and 330 may be injection locked through magnetic coupling 374.

Modifications, additions, or omissions may be made to the system 300 without departing from the scope of the present disclosure. For example, in some embodiments, the calibration module 340 may provide a separate frequency band select signal 348 to each of the first, second, and third oscillators 310, 320, and 330. In these and other embodiments, the first, second, and third oscillators 310, 320, and 330 may have different designs. As a result, the calibration module 340 may calibrate the second and third oscillators 320 and 330 using both the frequency band select signal 348 and the first and second tuning signals 344 and 346. Alternately or additionally, the system 300 may further include one or more dividers to divide the first, second, and third signals 311, 321, and 331 before providing the first, second, and third signals 311, 321, and 331 to the calibration module 340. In these and other embodiments, the divided first, second, and third signals 311, 321, and 331 may be compared by the calibration module 340. By providing the divided first, second, and third signals 311, 321, and 331 to the calibration module 340, a complexity of the circuitry to measure the frequency of the first, second, and third signals 311, 321, and 331 may be reduced and power requirements to provide the first, second, and third signals 311, 321, and 331 to the calibration module 340 may be reduced.

Figure 4:
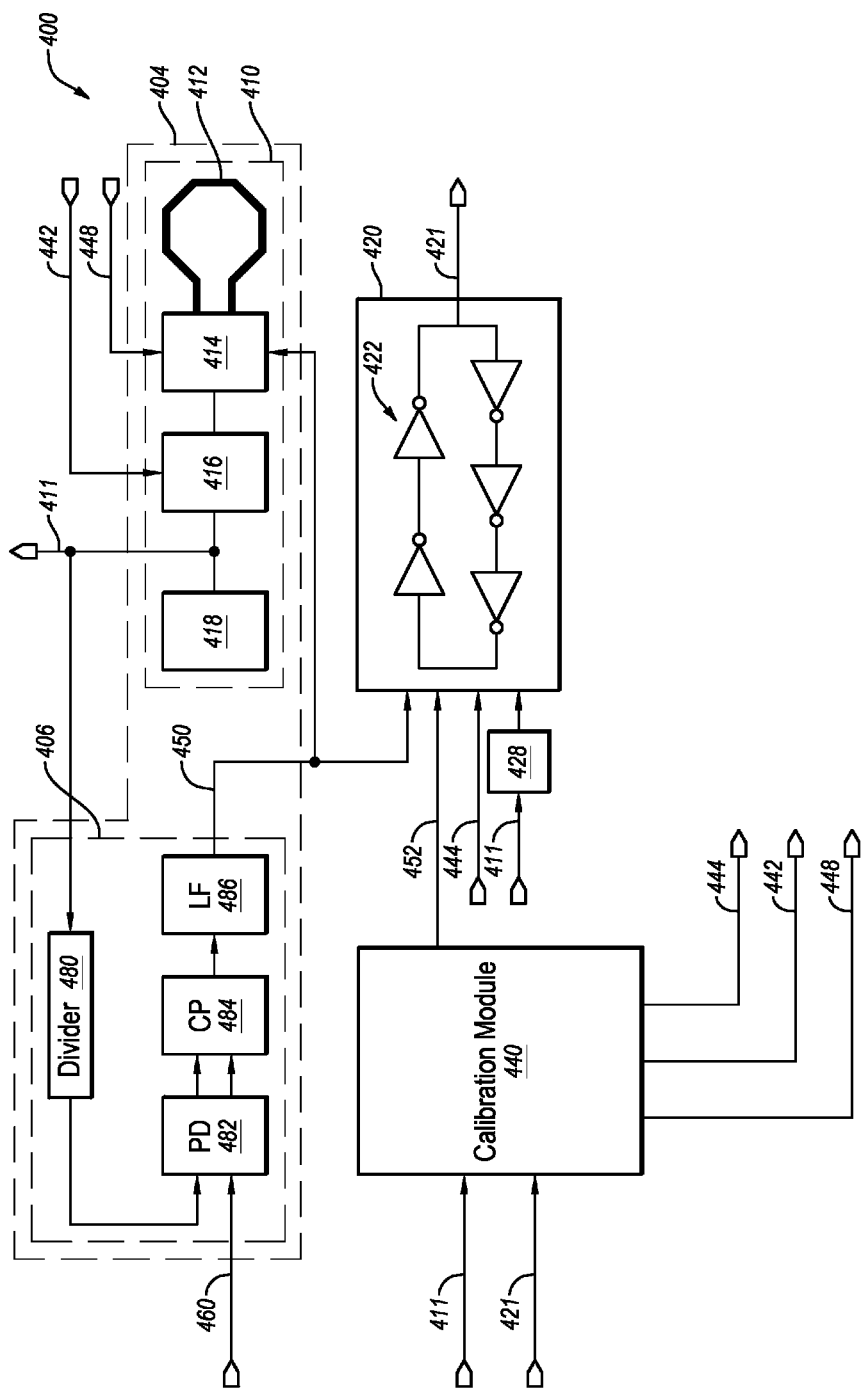
FIG. 4 is a block diagram of another example signal generation system.

FIG. 4 is a block diagram of another example signal generation system 400 ("the system 400"), arranged in accordance with at least one embodiment described herein. The system 400 may include a PLL 404, which includes a PLL control circuit 406 and a first oscillator 410; a second oscillator 420; and a calibration module 440.

As illustrated in FIG. 4, the first oscillator 410 may be an inductance-capacitance oscillator. The first oscillator 410 may include an inductor 412, a first capacitor bank 414, a second capacitor bank 416, and a gain block 418. The first oscillator 410 may be configured to generate a first signal 411 and to output the first signal 411 to the first oscillator 410, the PLL control circuit 406, and the calibration module 440. A frequency and a phase of the first signal 411 may depend on an amount of capacitance selected in the first capacitor bank 414 and the second capacitor bank 416 and the inductance of the inductor 412. The gain block 418 may provide energy to cause an oscillation between the capacitance selected in the first capacitor bank 414 and the second capacitor bank 416 and the inductance of the inductor 412 that results in the first signal 411.

An adjust signal 442 received from the calibration module 440 may select an amount of capacitance contributed by the second capacitor bank 416 to generate the first signal 411. A frequency band select signal 448 received from the calibration module 440 may select an amount of capacitance contributed by the first capacitor bank 414 to generate the first signal.

As illustrated in FIG. 4, the second oscillator 420 may be a ring oscillator that includes multiple amplifiers 422 coupled in a ring configuration. The second oscillator 420 may be configured to generate a second signal 421 and to output the second signal 421 to the second oscillator 420 and the calibration module 440. A frequency and a phase of the second signal 421 may depend on a supply voltage provided to the amplifiers 422. The supply voltage provided to the amplifiers 422 may be provided/adjusted by a tuning signal 444 from the calibration module 440, a PLL control signal 450 provided by the PLL control circuit 406, and/or a calibration control signal 452 provided by the calibration module 440. In some embodiments, the tuning signal 444 may provide coarse-tuning of the second oscillator 420, such as by selecting a frequency band of operation of the second oscillator 420. In these and other embodiments, the PLL control signal 450 and the calibration control signal 452 may provide fine-tuning of the second oscillator 420 within a frequency band of operation selected by the tuning signal 444.

Furthermore, the second oscillator 420 may be configured to receive the first signal 411 from the first oscillator 410 to electrically injection lock the second oscillator 420 with the first oscillator 410. Some amount of power of the first signal 411 may be provided to the second oscillator 420 to injection lock the second oscillator 420 with the first oscillator 410. A power circuit 428 may be included in the system 400 to attenuate the first signal 411 and provide a portion of the power of the first signal 411 to the second oscillator 420. In these and other embodiments, the first signal 411 may be received by the power circuit 428. The power circuit 428 may attenuate and buffer the first signal 411 and may provide the attenuated buffered first signal 411 to the second oscillator 420. In some embodiments, the power circuit 428 may include a capacitor. Alternately or additionally, the power circuit 428 may include some combination of active devices. For example, the power circuit 428 may include a combination of transistors configured as an amplifier that attenuates and buffers the first signal 411.

The PLL control circuit 406 may include a divider 480, a phase detector (PD) 482, a charge pump (CP) 484, and a low pass filter (LF) 486. The PLL control circuit 406 may be configured to generate the PLL control signal 450 based on a reference signal 460 and the first signal 411. The operation of the PLL control circuit 406 may be analogous to the operation of the PLL control circuit 306 of FIG. 3, and thus no further details are provided here.

In FIG. 4, the PLL control signal 450 is provided to the first and second oscillators 410 and 420. In particular, the PLL control signal 450 may be configured to adjust a capacitance of the first capacitor bank 414 used by the first oscillator 410 to generate the first signal 411 and to adjust a voltage supplied to the amplifiers 422 in the second oscillator 420 used to generate the second signal 421. In some embodiments, the PLL control signal 450 may be configured to adjust capacitances at the output of each amplifier 422 in the second oscillator 420 or to adjust operating currents provided to each amplifier 422 in the second oscillator 420.

The calibration module 440 may be configured to generate the adjust signal 442 and to output the adjust signal 442. The calibration module 440 may further be configured to generate the tuning signal 444 and to output the tuning signal 444, to generate the frequency band select signal 448 and to output the frequency band select signal 448, and to generate a calibration control signal 452 and to output the calibration control signal 452.

The calibration control signal 452 may be provided to the first capacitor bank 414 and may adjust a capacitance of the first capacitor bank 414 thereby adjusting a frequency and/or a phase of the first signal 411. The calibration control signal 452 may also be provided to the second oscillator 420 and may adjust a supply voltage provided to the amplifiers 422. As a result, the calibration control signal 452 may adjust a frequency and/or a phase of the second signal 421. Note that the calibration control signal 452 is provided to the first and second oscillators 410 and 420 during calibration of the system 400 and the PLL control signal 450 is provided to the first and second oscillators 410 and 420 during non-calibration operation of the system 400 so that both the PLL control signal 450 and the calibration control signal 452 are not provided to the first and second oscillators 410 and 420 at the same time.

The calibration module 440 may be further configured to enable or disable the PLL control circuit 406, the first oscillator 410, and the second oscillator 420. Note that FIG. 4 does not depict the calibration module 440 providing an enable signal to enable or disable the PLL control circuit 406, the first oscillator 410, and the second oscillator 420 for clarity, but the enable signals may be provided in similar manner as depicted in FIG. 1 with respect to the calibration module 130.

As noted above, at least a portion of the first signal 411 may be provided to the second oscillator 420 to electrically injection lock the second oscillator 420 with the first oscillator 410. An amount of power provided to the second oscillator 420 by the first signal 411 may depend on the difference between the free-running frequencies of the first signal 411 and the second signal 421. The system 400 is configured to calibrate the second oscillator 420 so that the free-running frequency of the second signal 421 is approximately equal to the free-running frequency of the first signal 411. In particular, the second oscillator 420 may be tuned by the calibration module 440 by adjusting the tuning signal 444.

A discussion of the calibration of the second oscillator 420 follows. In some embodiments, to begin calibration, the calibration module 440 may enable the first oscillator 410 and disable the second oscillator 420 and the PLL control circuit 406.

The calibration module 440 may then select a frequency band of operation for the first oscillator 410. Based on the desired frequency band, the calibration module 440 generates the frequency band select signal 448 and provides the frequency band select signal 448 to the first oscillator 410. If another frequency band is selected during operation of the system 400, the calibration of the system 400 may start over.

The calibration control signal 452 may then be generated by the calibration module 440 and provided to the first oscillator 410. In some embodiments, the calibration control signal 452 may be set at a value that is a middle value of the range of values for the calibration control signal 452. The adjust signal 442 may also be provided to the second capacitor bank 416 of the first oscillator 410. In some embodiments, the second capacitor bank 416 may be an array of fine tuning control varactors. In these and other embodiments, the adjust signal may be set so that the varactors in the second capacitor bank 416 are set at a center point.

With the first oscillator 410 generating the first signal 411 based on the adjust signal 442, the frequency band select signal 448, the calibration control signal 452, and the calibration module 440 may measure the free-running frequency of the first signal 411. In some embodiments, the frequency of the first signal 411 may be measured using a reference clock and a frequency counter.

After measuring the free-running frequency of the first oscillator 410, the calibration module 440 may disable the first oscillator 410. The calibration module 440 may provide the tuning signal 444 to the second oscillator 420. In some embodiments, the tuning signal 444 may be set at a center frequency band of the available frequency bands of the second oscillator 420.

After being enabled by the calibration module 440, the second oscillator 420 may generate the second signal 421 based on the tuning signal 444 and the calibration control signal 452. The calibration module 440 may measure a free-running frequency of the second signal 421 in a similar or different manner than the free-running frequency of the first signal 411 is measured. The calibration module 440 may also compare the free-running frequencies of the first and second signals 411 and 421. When the free-running frequency of the second signal 421 is greater than the free-running frequency of the first signal 411 by more than a threshold, the calibration module 440 may modify the tuning signal 444 by decreasing the tuning signal 444. When the free-running frequency of the second signal 421 is less than the free-running frequency of the first signal 411 by more than the threshold, the calibration module 440 may modify the tuning signal 444 by increasing the tuning signal 444. The calibration module 440 may continue to measure the free-running frequency of the second signal 421 and adjust the tuning signal 444 until the free-running frequency of the second signal 421 is within the range of the threshold of the free-running frequency of the first signal 411. A value of the tuning signal 444 that causes the free-running frequency of the second signal 421 to be within the range of the threshold of the free-running frequency of the first signal 411 may be stored by the calibration module 440. The calibration module 440 may then disable the second oscillator 420. The threshold may be selected based on the bandwidth of the frequency bands selected by the tuning signal 444, an amount of power to be supplied to the second oscillator 420 from the first signal 411 to provide injection locking between the first and second oscillators 410 and 420, among other criteria.

After calibrating the second oscillator 420, the calibration module 440 may stop providing the calibration control signal 452 and may enable the PLL control circuit 406 so that the PLL control signal 450 is provided to the first and second oscillators 410 and 420. The calibration module 440 may provide the frequency band select signal 448 and the adjust signal 442 to the first oscillator 410 and the calibrated tuning signal 444 to the second oscillator 420. With the second oscillator 420 calibrated, the free-running frequencies of the first and second signals 411 and 421 may be approximately equal. During injection locking, the frequencies of the first and second signals 411 and 421 may be the same.

By providing free-running frequencies of signals through calibration that are approximately equal, the system 400 may allow for injection locking between different types of oscillators. Alternately or additionally, the system 400 may allow the first and second oscillators 410 and 420 to have higher Q values and be electrically injection locked with low power input to the second oscillator 420 due to the free-running frequencies of the first and second signals 411 and 421 being approximately equal before injection locking.

Modifications, additions, or omissions may be made to the system 400 without departing from the scope of the present disclosure. For example, in some embodiments, the second oscillator 420 may be a same type of oscillator as the first oscillator 410. In these and other embodiments, the second oscillator 420 may be calibrated in a similar manner as described in FIG. 3. Alternately or additionally, the first oscillator 410 may be a ring type oscillator similar to the second oscillator 420. In these and other embodiments, the calibration module 440 may provide one signal to the first oscillator 410 similar to the tuning signal 444 provided to the second oscillator 420.

Alternately or additionally, the system 400 may further include one or more dividers to divide the first and second signals 411 and 421 before providing the first and second signals 411 and 421 to the calibration module 440. In these and other embodiments, the divided first and second signals 411 and 421 may be compared by the calibration module 440. By providing the divided first and second signals 411 and 421 to the calibration module 440, a complexity of circuitry to measure the frequency of the first and second signals 411 and 421 may be reduced and power requirements to provide the first and second signals 411 and 421 to the calibration module 440 may be reduced.

Furthermore, while the system 400 is depicted as including a single second oscillator 420, the system 400 may include multiple oscillators that may operate analogous to the second oscillator 420. Each of the multiple oscillators may receive the PLL control signal 450 from the PLL control circuit 406. Alternately or additionally, each of the multiple oscillators may receive an individual tuning signal from the calibration module 440 that is determined during a calibration mode for each of the multiple oscillators.

Figure 5A:
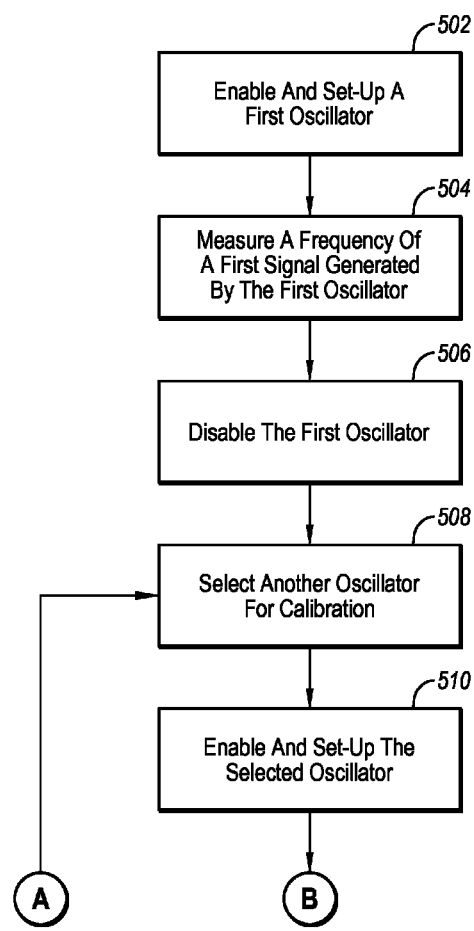
FIGS. 5A and 5B illustrate a flowchart of an example method of calibrating a signal generation system.
Figure 5B:
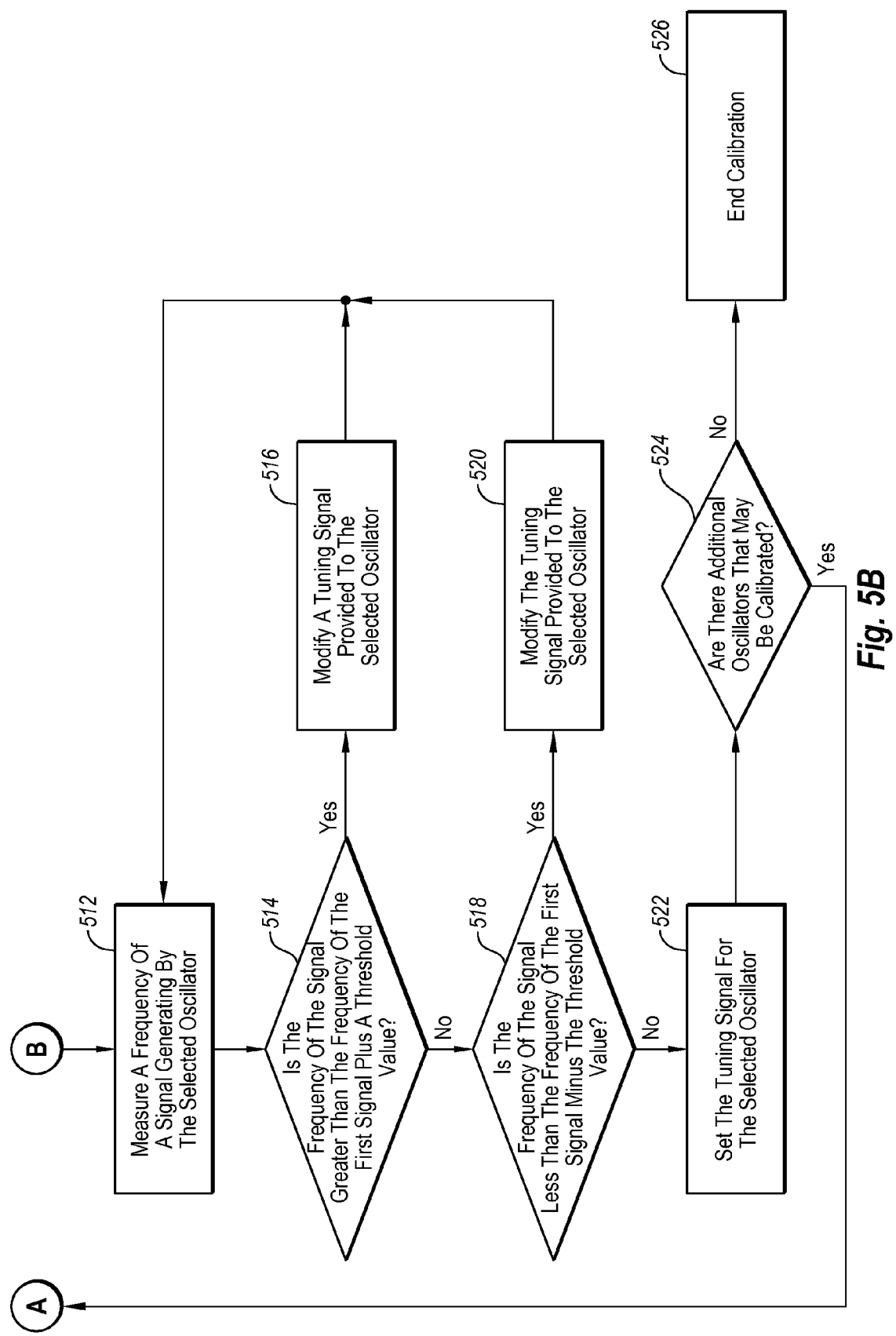

FIGS. 5A and 5B illustrate a flowchart of an example method 500 of calibrating a signal generation system, arranged in accordance with at least one embodiment described herein. The method 500 may be implemented, in some embodiments, by a signal generation system, such as the systems 100, 300, and/or 400 of FIGS. 1, 3, and 4, respectively. Although illustrated as discrete blocks, various blocks may be divided into additional blocks, combined into fewer blocks, or eliminated, depending on the desired implementation.

The method 500 may begin at block 502, where a first oscillator may be enabled and may be set up to generate a first signal. Setting up the first oscillator may include providing the first oscillator with one or more control signals that affect a free-running frequency of the first signal generated by the first oscillator.

In block 504, the free-running frequency of the first signal generated by the first oscillator may be measured. In block 506, the first oscillator may be disabled. In block 508, another oscillator may be selected for calibration.

In block 510, the selected oscillator may be enabled and set up to generate a signal. Setting up the selected oscillator may include providing the selected oscillator with one or more control signals that affect a free-running frequency of the signal generated by the selected oscillator.

In block 512, the free-running frequency of the signal generated by the selected oscillator may be measured.

In block 514, it may be determined whether the free-running frequency of the signal is greater than the free-running frequency of the first signal plus a threshold value. The threshold value may be based on the coupling strength between the first oscillator and the selected oscillator, a design of a system that includes the first oscillator and the selected oscillator, power requirements for the system that includes the first oscillator and the selected oscillator, among others.

When the free-running frequency of the signal is greater than the free-running frequency of the first signal plus the threshold value ("Yes" at block 514), the method 500 may proceed to block 516. When the free-running frequency of the signal is not greater than the free-running frequency of the first signal plus the threshold value ("No" at block 514), the method 500 may proceed to block 518.

In block 516, a tuning signal provided to the selected oscillator may be modified. The tuning signal may be one of the control signals provided to the selected oscillator that affects the free-running frequency of the signal. In particular, the tuning signal may be modified to decrease the free-running frequency of the signal. Modifying the tuning signal to decrease the free-running frequency of the signal may include increasing or decreasing the tuning signal based on the configuration of the selected oscillator.

In block 518, it may be determined whether the free-running frequency of the signal is less than the free-running frequency of the first signal minus the threshold value. When the free-running frequency of the signal is less than the frequency of the first signal minus the threshold value ("Yes" at block 518), the method 500 may proceed to block 520. When the free-running frequency of the signal is not less than the free-running frequency of the first signal minus the threshold value ("No" at block 518), the method 500 may proceed to block 522.

In block 520, the tuning signal provided to the selected oscillator may be modified. In particular, the tuning signal may be modified to increase the free-running frequency of the signal. Modifying the tuning signal to increase the free-running frequency of the signal may include increasing or decreasing the tuning signal based on the configuration of the selected oscillator.

In block 522, the tuning signal may be set for the selected oscillator. Additionally, the selected oscillator may be disabled.

In block 524, it may be determined if there are additional oscillators that may be calibrated. When there are additional oscillators that may be calibrated ("Yes" at block 524), the method 500 may proceed to block 508. When there are not additional oscillators that may be calibrated ("No" at block 524), the method 500 may proceed to block 526. In block 526, the calibration may end.

The method 500 may include additional steps and/or operations. For example, the method 500 may include enabling a PLL control circuit that may be configured to provide a control signal to the first oscillator and each calibrated oscillator. Alternately or additionally, the method 500 may further include providing each calibrated oscillator with its corresponding set tuning signal and enabling the first oscillator and each calibrated oscillator.

In some embodiments, a calibration module, such as the calibration module 130, 340, and 440 of FIGS. 1, 3, and 4, respectively, may be implemented using computer-readable media for carrying or having computer-executable instructions or data structures stored thereon. Such computer-readable media may be any available media that may be accessed by a general purpose or special purpose computer. By way of example, and not limitation, such computer-readable media may include tangible or non-transitory computer-readable storage media including Random Access Memory (RAM), Read-Only Memory (ROM), Electrically Erasable Programmable Read-Only Memory (EEPROM), Compact Disc Read- Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions may include, for example, instructions and data, which cause a general purpose computer, special purpose computer, or special purpose processing device (e.g., one or more processors) to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the terms "module" or "component" may refer to specific hardware implementations configured to perform the operations of the module or component and/or software objects or software routines that may be stored on and/or executed by general purpose hardware (e.g., computer-readable media, processing devices, etc.) of the computing system. In some embodiments, the different components, modules, engines, and services described herein may be implemented as objects or processes that execute on the computing system (e.g., as separate threads). While some of the system and methods described herein are generally described as being implemented in software (stored on and/or executed by general-purpose hardware), specific hardware implementations or a combination of software and specific hardware implementations are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A system for signal generation, the system comprising:
   a phase-locked-loop including a first oscillator, the first oscillator configured to generate a first signal based on a phase-locked-loop control signal generated by the phase-locked-loop; and
   a second oscillator configured to generate a second signal based on the phase-locked-loop control signal directly; and
   a calibration module configured to generate and modify a tuning signal, the second signal also based on the tuning signal, the tuning signal based on a comparison of a frequency of the first signal and a frequency of the second signal, and the calibration module configured to modify the tuning signal such that the frequency of the first signal is approximately equal to the frequency of the second signal to obtain injection locking between the first oscillator and the second oscillator.

2. The system of claim 1, wherein the injection locking between the first oscillator and the second oscillator is magnetic injection locking.

3. The system of claim 1, wherein the injection locking between the first oscillator and the second oscillator is electrical injection locking by providing a portion of the power derived from the first signal to the second oscillator.

4. The system of claim 1, wherein the second signal is further based on the first signal.

5. The system of claim 1, wherein the first signal is a free-running first signal and the second signal is a free-running second signal, wherein the calibration module generates the tuning signal during a calibration mode by:
   comparing the free-running first signal and the free-running second signal, the free-running first signal being generated by the first oscillator based on a calibration control signal generated by the calibration module during the calibration mode, and the free-running second signal being generated by the second oscillator based on the tuning signal and the calibration control signal during the calibration mode; and
   modifying the tuning signal until a frequency of the free-running first signal and a frequency of the free-running second signal are approximately equal.

6. The system of claim 1, wherein the tuning signal determines an amount of capacitance used by the second oscillator to generate the second signal.

7. The system of claim 6, wherein the first signal and the second signal are further based on a frequency band select signal.

8. The system of claim 6, wherein the first oscillator and the second oscillator are of a same oscillator type.

9. The system of claim 1, wherein the tuning signal determines a frequency band of operation for the second oscillator.

10. The system of claim 9, wherein the first oscillator is of a first oscillator type and the second oscillator is of a second oscillator type different from the first oscillator type.

11. The system of claim 10, wherein the first oscillator type is an LC-tank oscillator and the second oscillator type is a ring oscillator.

12. A method of signal generation, the method comprising:
   generating a free-running first signal using a first oscillator in a phase-locked-loop, the free-running first signal being based on a calibration control signal;
   generating a free-running second signal using a second oscillator, the free-running second signal being based on the calibration control signal and a tuning signal;
   generating the tuning signal based on a comparison of a frequency of the free-running first signal and a frequency of the free-running second signal;
   modifying the tuning signal until the frequency of the free-running first signal and the frequency of the free-running second signal are approximately equal;
   generating a phase-locked-loop first signal using the first oscillator in the phase-locked-loop, the phase-locked-loop first signal being based on a phase-locked-loop control signal generated by the phase-locked-loop; and
   generating an injection locked second signal using the second oscillator, the injection locked second signal based on the phase-locked-loop control signal and the tuning signal such that a frequency of the phase-locked-loop first signal and a frequency of the injection locked second signal are equal.

13. The method of claim 12, wherein the frequency of the phase-locked-loop first signal and the frequency of the injection locked second signal are equal from injection locking between the first oscillator and the second oscillator.

14. The method of claim 12, further comprising disabling the first oscillator when modifying the tuning signal until the frequency of the free-running first signal and the frequency of the free-running second signal are approximately equal.

15. The method of claim 12, wherein modifying the tuning signal modifies a capacitance used by the second oscillator to generate the free-running second signal.

16. The method of claim 15, wherein the phase-locked-loop first signal and the injection locked second signal are further based on a frequency band select signal.

17. The method of claim 12, wherein modifying the tuning signal modifies a frequency band of operation of the second oscillator.

18. The method of claim 17, further comprising supplying at least a portion of the phase-locked-loop first signal to the second oscillator to obtain electrical injection locking between the first oscillator and the second oscillator.

19. The method of claim 17, wherein the first oscillator is of a first oscillator type and the second oscillator is of a second oscillator type different from the first oscillator type.

* * * * *